United States Patent [19]
Fischer et al.

[11] 3,956,765
[45] May 11, 1976

[54] INTEGRATED SEMICONDUCTOR ARRANGEMENT

[75] Inventors: Horst Fischer, Heilbronn; Willi Pschunder, Flein, both of Germany

[73] Assignee: Licentia Patent-Verwaltungs-G.m.b.H., Frankfurt am Main, Germany

[22] Filed: Oct. 24, 1973

[21] Appl. No.: 411,461

[30] Foreign Application Priority Data
Nov. 3, 1972    Germany.............................. 2253830

[52] U.S. Cl..................................... 357/30; 357/15; 357/71
[51] Int. Cl.²......................................... H01L 27/14
[58] Field of Search.... 317/235 N, 235 UA, 234 M; 357/30, 15, 71

[56] References Cited
UNITED STATES PATENTS

| | | | |
|---|---|---|---|
| 3,290,127 | 12/1966 | Kahng................................... | 29/195 |
| 3,452,204 | 6/1969 | Love...................................... | 250/211 |
| 3,460,003 | 8/1969 | Hampkian............................ | 317/234 |
| 3,567,508 | 3/1971 | Cox et al. ............................ | 117/212 |
| 3,668,481 | 6/1972 | Saltich ................................. | 317/234 |
| 3,717,799 | 2/1973 | Chapman......................... | 317/234 R |
| 3,742,223 | 6/1973 | Carr................................... | 250/211 J |
| 3,760,241 | 9/1973 | Epple.............................. | 317/235 R |

*Primary Examiner*—Martin H. Edlow
*Attorney, Agent, or Firm*—Spencer & Kaye

[57]        ABSTRACT

An integrated semiconductor arrangement comprises a semiconductor body having a solar cell and a rectifying metal-semiconductor contact. The invention also includes a method of making such an arrangement.

9 Claims, 5 Drawing Figures

U.S. Patent   May 11, 1976   3,956,765
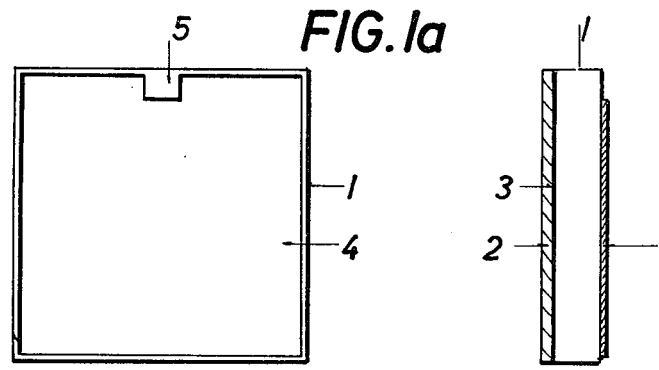
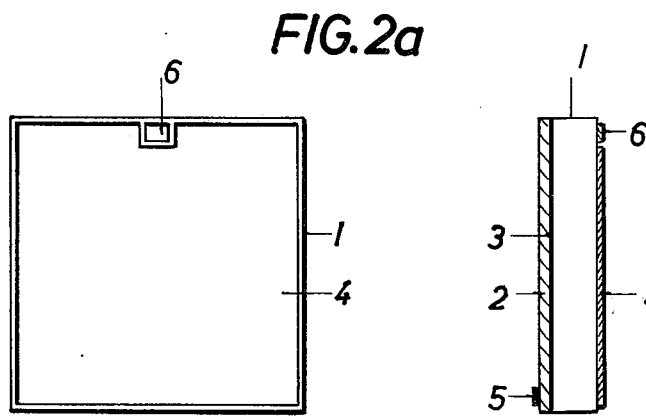
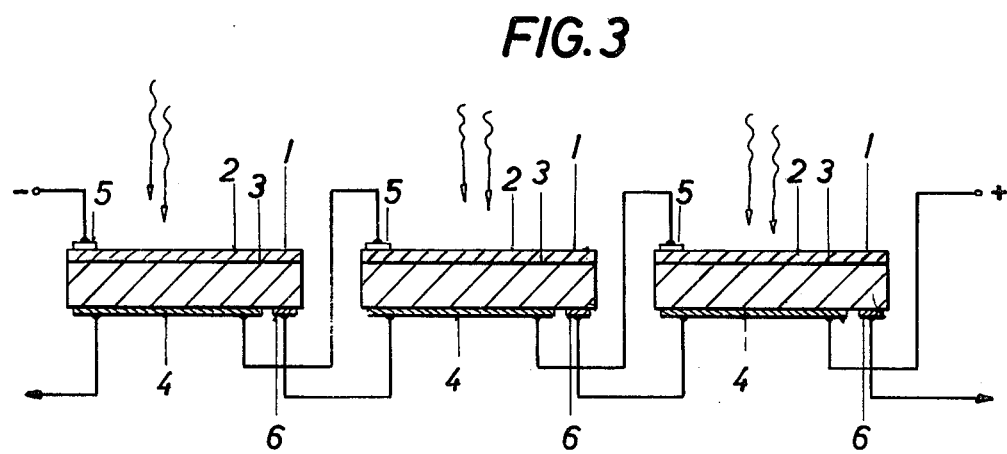

INTEGRATED SEMICONDUCTOR ARRANGEMENT

BACKGROUND OF THE INVENTION

This invention relates to an integrated semiconductor arrangement.

SUMMARY OF THE INVENTION

It is an object of the invention to improve solar cells for the use in generator technology, in which solar cells are connected together to form a solar cell battery and to provide a simple as possible production method.

According to a first aspect of the invention, there is provided an integrated semiconductor arrangement characterized in that the semiconductor body has, in addition to a solar cell, a rectifying metal-semiconductor contact.

According to a second aspect of the invention, there is provided an integrated semiconductor arrangement comprising a semiconductor body, a solar cell in said semiconductor body and a rectifying metal-semiconductor contact on said semiconductor body.

BRIEF DESCRIPTION OF THE DRAWINGS

The invention will now be described in greater detail, by way of example, with reference to the drawings, in which:

FIG. 1a is a first view of a semiconductor body in a first stage in the production of a semiconductor arrangement according to the invention;

FIG. 1b is a side view of the semiconductor body of FIG. 1a;

FIG. 2a is a view similar to FIG. 1a but showing a second stage of the production;

FIG. 2b is a view similar to FIG. 1b of a second stage of the production, and

FIG. 3 shows diagrammatically the connection of a plurality of integrated semiconductor arrangements to form a solar cell battery.

DESCRIPTION OF THE PREFERRED EMBODIMENT

Basically, the invention proposes an integrated semiconductor arrangement in which the semiconductor body has, in addition to a solar cell, a rectifying metal-semiconductor contact.

In accordance with one form of the invention, the ohmic electrodes of the solar cell and the rectifying metal-semiconductor contact may be produced from the same material. The ohmic electrodes of the solar cell and the rectifying metal-semiconductor contact may comprise, for example, a metal combination. When using a semiconductor body of silicon, the metal combination may comprise, for example, two layers each, that is to say a first layer, for example of titanium or chromium and a second layer, for example of silver. In this case, for example, a solder may be additionally applied to the silver layer.

In accordance with another form of the invention, likewise with the use of a semiconductor body of silicon, an intermediate layer, which comprises, for example, palladium or platinum may be additionally provided between the first layer and the second layer. In this case no solder is necessary on the second layer.

The rectifying contact and the ohmic contacts are produced in accordance with the invention by different heat treatments. The production of the ohmic contacts requires a temperature which lies above the temperature which is necessary for the production of the rectifying contact. A correspondingly high temperature is necessary for the production of the ohmic contact.

The production of an integrated semiconductor arrangement in accordance with the invention may be effected, for example, by diffusing into one surface side of a semiconductor body of the first type of conductivity a semiconductor region of the opposite type of conductivity which forms the pn-junction of the solar cell with the semiconductor body. Thereafter the rear side contact of the solar cell may be applied over a large area onto the opposite surface of the semiconductor body, that is to say in such a manner that a recess for the rectifying metal-semiconductor contact remains. This rear side contact is tempered. After completion of the rear side contact the front side contact is applied and likewise tempered. The still missing metal-semiconductor contact is applied in the region of the recess and tempered like the other contacts. The temperature for the metal-semiconductor contact however is less than the temperature for the ohmic contacts.

The connecting together of a plurality of integrated semiconductor arrangements to form a solar cell battery may be effected in each case by connecting the rear side contact of one integrated semiconductor arrangement to the front side contact of the subsequent integrated semiconductor arrangement and by connecting the metal-semiconductor contact of one integrated semiconductor arrangement to the rear side contact of the subsequent integrated semiconductor arrangement. The front side contact of one of the two integrated semiconductor arrangements lying on the outside, may serve, in such a solar cell battery, as a negative pole of the solar cell battery and the rear side contact of the other of the two integrated semiconductor arrangements, lying on the outside, serves as the positive pole of the solar cell battery.

Referring to the drawings, FIGS. 1 and 2 show the production of an integrated semiconductor arrangement in accordance with the invention with a metal-semiconductor contact on the rear side of the solar cell body. The production is started, for example, in FIG. 1, from a semiconductor body 1 of p-type conductivity and into this semiconductor body, in accordance with FIG. 1b, on the one surface side a semiconductor region 2 of n-type conductivity is diffused. In this case the pn-junction 3 of the solar cell results. The semiconductor body 1 preferably comprises silicon. The conductivity of the semiconductor body 1 is for example, from 1 to 10 Ohmcm.

Finally, in accordance with FIG. 1a the rear side contact 4 for the solar cell is applied to the rear side of the semiconductor body 1. In this case a recess 5 for the rectifying metal-semiconductor contact is left on the rear side of the semiconductor body. FIG. 1b shows a sectional view at the level of this recess. The rear side contact 4 comprises, for example, the layer sequence titanium-palladium-silver. The rear side contact is produced, for example, by evaporation. In order to achieve the recess 5 during evaporation of the rear side contact, the use of an evaporation mask is recommended.

After the evaporation, the rear side contact 4 is rectifying without any corresponding tempering treatment. It obtains the necessary ohmic property only by a tempering process, in which the contact is sintered. This temperature treatment is effective, for example, at a temperature of between 610° and 620°C. The tempering time is, for example, 10 minutes.

The front side contact is produced after the production of the rear side contact. To produce the front side contact 5 which can be seen in FIG. 2b, for example, the same metal layers are used as are used for the rear side contact. The front side contact is likewise produced preferably by evaporation and made ohmic by a corresponding tempering process.

After the production of the front side contact 5 metal is evaporated onto the recessed surface to produce the rectifying metal semiconductor contact 6 on the rear side in accordance with FIG. 2. This is also preferably effected using a metal mask. Evaporation has to be so undertaken that the rectifying metal semiconductor contact 6 and the rear side contact 4 do not touch each other. The metal semiconductor contact 6 preferably comprises the same material as the rear side and front side contacts. In order to obtain the rectifying properties of a titanium-palladium-silver layer sequence for the metal-semiconductor contact, which are already present after evaporation without tempering treatment in conjunction with the p-type conductivity silicon, a subsequent tempering treatment must not take place at such a temperature that the contact is made ohmic. The rectifying properties in general are not lost during a tempering treatment up to a temperature of approximately 600°C. A tempering treatment is necessary in the case of rectifying contacts in order to increase the adhesive strength. In the tempering treatment of the rectifying metal-semiconductor contact however it will be kept below the temperature, which at last substantially impairs the rectifying properties and, for example, will be carried out at a temperature of 400°C. The tempering time in this case amounts to, for example, 5 minutes.

Finally FIG. 3 additionally shows the connection of integrated semiconductor arrangements according to the invention to form a solar cell battery. In the embodiment of FIG. 3, three integrated semiconductor arrangements in accordance with the invention are combined to form a solar cell battery. FIG. 3 explains only the basic principle. In reality, of course, a relatively large number of semiconductor arrangements in accordance with the invention are generally combined to form a solar cell battery.

As FIG. 3 shows, the connection to form a solar cell battery consists in that, in each case, the rear side contact 4 of one integrated semiconductor arrangement is connected to the front side contact 5 of the subsequent integrated semiconductor arrangement and the metal semiconductor layer 6 of the one integrated semiconductor arrangement is connected to the rear side 4 of the subsequent integrated semiconductor arrangement. In the case of such a solar cell battery, the front side contact 5 of one of the two semiconductor arrangements, located on the outside, serves as the negative pole and the rear side contact of the other of the two integrated semiconductor arrangements lying on the outside, serves as the positive pole of the solar cell battery.

It will be understood that the above description of the present invention is susceptible to various modifications, changes and adaptations.

What is claimed is:

1. A solar cell battery comprising a plurality of series connected integrated semiconductor arrangements with each of said integrated semiconductor arrangements comprising: a solar cell including a semiconductor body of a first conductivity type having a region of the opposite conductivity type adjacent one major surface thereof and forming the pn-junction of the solar cell, a front side contact for said solar cell ohmically contacting said region of opposite conductivity type on said one major surface, and a rear side contact for said solar cell ohmically contacting the opposite major surface of said semiconductor body; and a rectifying metal-semiconductor contact on one of said major surfaces and contacting said semiconductor body; and wherein, in each case, the rear side contact of one integrated semiconductor arrangement is connected to the front side contact of the subsequent integrated semiconductor arrangement and the metal-semiconductor contact of one integrated semiconductor arrangement is connected to the rear side contact of the subsequent integrated semiconductor arrangement.

2. A solar cell battery as defined in claim 1, wherein the said ohmic contacts of said solar cell and said rectifying metal-semiconductor contact comprise the same material which has been subjected to different heat treatments.

3. A solar cell battery as defined in claim 2, wherein said ohmic electrodes of said solar cell and said rectifying metal-semiconductor contact comprise a plurality of layers of different metals.

4. A solar cell battery as defined in claim 3, wherein said semiconductor body is made of silicon, and said ohmic contacts of said solar cell and said metal-semiconductor contact each comprise a first layer of titanium or chromium in contact with the semiconductor body, an overlying second layer of silver and an intermediate layer of palladium or platinum between said first layer and said second layer.

5. A solar cell battery as defined in claim 1, wherein the semiconductor body has p-type conductivity.

6. A solar cell battery as defined in claim 1, wherein the front side contact of one of the two integrated semiconductor arrangements at the outer ends of said series connection is provided as the negative pole and the rear side contact of the other of said two integrated semiconductor arrangements is provided as the positive pole of the solar cell battery.

7. A solar cell battery as defined in claim 1, wherein said rectifying metal semiconductor contact is on said opposite major surface.

8. A solar cell battery as defined in claim 7 wherein said region of opposite conductivity type extends along the entire said one major surface.

9. A solar cell battery comprising a plurality of series connected integrated semiconductor arrangements with each of said integrated semiconductor arrangements comprising: a solar cell including a semiconductor body having a first region of a first conductivity type extending entirely along one major surface of said body and a second region of the opposite conductivity type extending entirely along the opposite major surface of said body with said first and second regions forming the pn junction for said solar cell therebetween adjacent one of said major surfaces of said body, and ohmic front side and rear side contacts on the respective opposite major surfaces of said body; and a rectifying metal-semiconductor contact on one of said major surfaces and contacting said semiconductor body; and wherein, in each case, the rear side contact of one integrated semiconductor arrangement is connected to the front side contact of the subsequent integrated semiconductor arrangement and the metal-semiconductor contact of one integrated semiconductor arrangement is connected to the rear side contact of the subsequent integrated semiconductor arrangement.

* * * * *